United States Patent
Yamaguchi et al.

(10) Patent No.: US 9,929,237 B2
(45) Date of Patent: Mar. 27, 2018

(54) METHOD FOR MANUFACTURING GRAPHINE FILM ELECTRONIC DEVICE

(71) Applicant: FUJITSU LIMITED, Kawasaki-shi, Kanagawa (JP)

(72) Inventors: Junichi Yamaguchi, Atsugi (JP); Shintaro Sato, Atsugi (JP); Hiroko Yamada, Ikoma (JP); Kazuki Tanaka, Ikoma (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/924,084

(22) Filed: Oct. 27, 2015

(65) Prior Publication Data
US 2016/0056240 A1    Feb. 25, 2016

Related U.S. Application Data

(63) Continuation of application No. PCT/JP2014/052864, filed on Feb. 7, 2014.

(30) Foreign Application Priority Data

May 1, 2013 (JP) .................. 2013-096591

(51) Int. Cl.
H01L 29/16 (2006.01)
H01L 29/66 (2006.01)
(Continued)

(52) U.S. Cl.
CPC ........ *H01L 29/1606* (2013.01); *C01B 32/182* (2017.08); *C01B 32/186* (2017.08);
(Continued)

(58) Field of Classification Search
CPC ......... H01L 29/66742; H01L 29/78684; H01L 29/78696; H01L 29/04; H01L 29/1606;
(Continued)

(56) References Cited

U.S. PATENT DOCUMENTS 9,233,845 B2 * 1/2016 Gerasimos ............. B82Y 10/00
2012/0195821 A1    8/2012 Sun
(Continued)

FOREIGN PATENT DOCUMENTS

CN  102598277 A   7/2012
JP  2009-70911 A1  4/2009
(Continued)

OTHER PUBLICATIONS

Terrones et al., "Graphene and graphite nanoribbons: Morphology, properties, synthesis, defects and applications", 2010, Nano Today, vol. 5, pp. 351-372, published Aug. 2, 2010.*

(Continued)

*Primary Examiner* — Nikolay Yushin
(74) *Attorney, Agent, or Firm* — Kratz, Quintos & Hanson, LLP

(57) ABSTRACT

A GNR is a ribbon-shaped graphene film which includes: five or more (for example, five, seven, or nine) six-membered rings of carbon atoms which are bonded and arranged in line in a short side direction; and a complete armchair type edge structure along a long side direction. By such a constitution, without using a transfer method, there are materialized a highly reliable graphene film which has an armchair type edge structure with a uniform width at a desired value and which enables an electric current on-off ratio of $10^5$ or more that is practically sufficient for exhibiting a desired band gap.

4 Claims, 5 Drawing Sheets

(51) Int. Cl.
| | |
|---|---|
| H01L 29/786 | (2006.01) |
| H01L 21/02 | (2006.01) |
| H01L 29/04 | (2006.01) |
| H01L 29/06 | (2006.01) |
| C01B 32/182 | (2017.01) |
| C01B 32/186 | (2017.01) |
| H01L 23/532 | (2006.01) |

(52) U.S. Cl.
CPC ...... *H01L 21/0242* (2013.01); *H01L 21/0262* (2013.01); *H01L 21/02491* (2013.01); *H01L 21/02513* (2013.01); *H01L 21/02516* (2013.01); *H01L 21/02527* (2013.01); *H01L 21/02603* (2013.01); *H01L 21/02645* (2013.01); *H01L 29/04* (2013.01); *H01L 29/0665* (2013.01); *H01L 29/66742* (2013.01); *H01L 29/78603* (2013.01); *H01L 29/78684* (2013.01); *H01L 29/78696* (2013.01); *C01B 2204/06* (2013.01); *C01B 2204/22* (2013.01); *H01L 23/53276* (2013.01); *H01L 2924/0002* (2013.01)

(58) Field of Classification Search
CPC ........... H01L 29/0665; H01L 29/78603; H01L 21/0262; H01L 21/02645; H01L 21/0259; H01L 21/02527; H01L 21/0242; H01L 21/02603; H01L 21/02491; H01L 21/02513; H01L 21/02516; H01L 23/53276; H01L 2924/0002; H01L 2924/00; C01B 31/0438; C01B 2204/06; C01B 2204/22
See application file for complete search history.

(56) References Cited

U.S. PATENT DOCUMENTS

| | | | |
|---|---|---|---|
| 2012/0199815 A1 | 8/2012 | Kondo | |
| 2012/0261644 A1 | 10/2012 | Dimitrakopoulos | |
| 2013/0032782 A1* | 2/2013 | Gerasimos | B82Y 10/00 257/21 |
| 2014/0315023 A1* | 10/2014 | Fasel | C01B 31/0438 428/401 |
| 2015/0137076 A1 | 5/2015 | Kondo | |

FOREIGN PATENT DOCUMENTS

| | | |
|---|---|---|
| JP | 2010-187062 A1 | 8/2010 |
| JP | 2012-158514 A1 | 8/2012 |
| WO | 2011/058651 A1 | 5/2011 |
| WO | 2013061258 A1 | 5/2013 |
| WO | 2013072292 A1 | 5/2013 |

OTHER PUBLICATIONS

Schwierz, "Graphene transistors", 2010, Nature Nanotechnology, vol. 5, pp. 487-496.*
Pallecchi et al., "Graphene microwave transistors on sapphire substrates", 2011, Applied Physics Letters, vol. 99, p. 113502, published Sep. 12, 2011.*
Wang et al., "Scalable and Direct Growth of Graphene Micro Ribbons on Dielectric Substrates", 2013, Scientific Reports, Vo. 3, 1348, pp. 1-7, published Feb. 27, 2013.*
Ago et al., "Epitaxial Chemical Vapor Deposition Growth of Single-Layer Graphene over Cobalt Film Crystallized on Sapphire", 2010, ASNANO, vol. 4, No. 12 pp. 7407-7414, published Nov. 24, 2010.*
Jun et al., "Graphene films grown on sapphire substrates via solid source molecular beam epitaxy", 2012, Chin. Phys. B, vol. 21, No. 5, p. 057303, published May 2012.*
de Heer et al., "Epitaxial graphene", 2007, Solid State Communications, vol. 143, pp. 92-100, published Apr. 27, 2007.*
Office Action of Taiwanese Patent Application 103104242 dated Oct. 23, 2015; translation of the relevant part of Office Action.
L. Yang, et al.; "Quasiparticle Energies and Band Gaps in Graphene Nanoribbons;" Physical Review Letters; vol. 99; 2007; pp. 186801-1-186801-4 (4 Sheets)/p. 3 of specification.
M. Han, et al.; "Energy Band-Gap Engineering of Graphene Nanoribbons;" Physical Review Letters; vol. 98; 2007; pp. 206805-1-206805-4 (4 Sheets)/p. 3 of specification.
X. Li, et al.; "Chemically Derived, Ultrasmooth Graphene Nanoribbon Semiconductors;" Science; vol. 319; Feb. 29, 2008; pp. 1229-1232 and cover sheet (5 Sheets)/p. 3 of specification.
J. Cai, et al.; "Atomically precise bottom-up fabrication of graphene nanoribbons;" Nature; vol. 466; Jul. 22, 2010; pp. 470-473 (4 Sheets)/p. 3 of specification.
X. Yang, et al.; "Graphene Tunneling FET and its Applications in Low-power Circuit Design;" GLSVLSI' 10, May 16-18, 2010, Providence, Rhode Island, USA; pp. 263-268 (6 Sheets)/Cited in Taiwanese Office Action dated Feb. 17, 2015 for corresponding Taiwanese Patent Application 103104242.
Office Action of Taiwanese Patent Application 103104242 dated Feb. 17, 2015 (7 Sheets and 5 Sheets translation, 12 Sheets total).
Written Opinion of the International Searching Authority of PCT/JP2014/052864 dated Mar. 6, 2014 (3 Sheets and 2 Sheets translation, 5 Sheets total).
International Search Report for International Application No. PCT/JP2014/052864 dated Mar. 18, 2014.
Japanese Application No. 2013-096591: Office Action dated Oct. 18, 2016 with partial translation.
Barone, V. et al., Electronic Structure and Stability of Semiconducting Graphene Nanoribbons, Nano Letters, Nov. 24, 2006, vol. 6, No. 12, pp. 2748-2754.
Nguyen, V. Hung, et al., Controllable spin-dependent transport in armchair graphene nanoribbon structures, J Appl Phys, Sep. 1, 2009, vol. 106, No. 5, p. 053710.
Xia, T. et al., The Effective Mass, Band Gap, Device Characteristics, and Performance Considerations for AGNR and AGNRFETs, IEEE Trans Electron Devices, Sep. 2012, vol. 59, No. 9, pp. 2290-2295.
Office Action of Japanese Patent Application 2013-096591 dated Jan. 24, 2017; full machine translation of the Office Action.
Taiwanese Patent Application No. 103104242: Official Letter dated Apr. 27, 2017 (Translation of relevant part).

* cited by examiner

METHOD FOR MANUFACTURING GRAPHINE FILM ELECTRONIC DEVICE

CROSS-REFERENCE TO RELATED APPLICATIONS

This application is a continuation application of International Application PCT/JP2014/052864 filed on Feb. 7, 2014 and designated the U.S., which claims the benefit of priority of the prior Japanese Patent Application No. 2013-096591, filed on May 1, 2013, the entire contents of which are incorporated herein by reference.

FIELD

The embodiments discussed herein are directed to a graphene film, an electronic device which uses the graphene film, and a method for manufacturing the electronic device.

BACKGROUND

A graphene, which has a sheet structure of a monoatomic layer in which carbon atoms are arranged in a honeycomb lattice shape, exhibits quite high mobility at a room temperature, and thus is expected to be adapted for a next-generation electronics material, particularly for a channel material of a field-effect transistor (FET) of low power consumption and fast operation. However, in the graphene, since $\pi$ electron conjugate expands two-dimensionally, a band gap is equal to zero and the graphene exhibits a metallic physicality, so that a practically sufficient electric current on-off ratio cannot be obtained in a transistor which uses the graphene as a channel. Therefore, in order to adapt the graphene for a transistor, it is necessary to introduce a band gap to the graphene and to make the graphene into a semiconductor.

As one of methods for introducing a band gap to a graphene, there is a method in which a two-dimensional graphene sheet is made into a strip state of several nm to several tens of nm in width and ribbonized one-dimensionally, whereby a graphene nanoribbon (GNR) is formed. It is known that, in the GNR, the band gap is opened by a quantum confined effect and that its gap size is changed depending on a ribbon width (for example, see Non-patent Document 1).

As a method for manufacturing a GNR, there are reported a method of forming by using a negative resist (hydro silsesquioxane) by electron beam lithography (for example, see Non-patent Document 2), a method of chemically cutting open a carbon nanotube (for example, see Patent Document 1), a method of forming from graphite flakes dissolved in an organic solvent by a sonochemical method (for example, see Non-patent Document 3), and so on.

In recent years, there is depicted a method in which an anthracene dimer is synthesized, vapor-deposited under ultrahigh vacuum on a metal substrate of Au or Ag that has a flat (111) crystal surface at an atomic level, and coupled/condensed by a radical reaction by substrate heating, whereby a GNR is formed in a bottom up manner (for example, see Non-patent Document 4).

CITATION LIST

Patent Document

Patent Document 1: Japanese Laid-open Patent Publication No. 2012-158514

Non-Patent Document

Non-patent Document 1: L. Yang et al., Phys. Rev. Lett. 99, 186801 (2007)
Non-patent Document 2: M. Y. Han et al., Phys. Rev. Lett. 98, 206805 (2007)
Non-patent Document 3: X. Li et al., Science 319, 1229 (2008)
Non-patent Document 4: J. Cai et al., Nature 466, 470 (2010)

There exist two kinds of GNR edge structures, of what is called a zigzag type in which carbon atoms are arranged in a zigzag shape, and of what is called an armchair type in which carbon atoms are arranged at a two-atom period. The armchair type GNR has a band gap and exhibits a semiconductive property. In contrast, the zigzag type GNR exhibits a metallic property.

When the GNR is formed by a method depicted in Non-patent Document 2, Non-patent Document 3, or Patent Document 1 described above, there is a problem that control of a uniform edge structure is difficult and that the zigzag type edge structure and the armchair type edge structure exist in a mixed manner. Further, it is also difficult to make ribbon widths uniform.

To form an armchair type GNR in which edge structures and ribbon widths are uniform, a method of polymerizing on an Au (111) substrate or an Ag (111) substrate from an anthracene dimer by thermal energy as depicted in Non-patent Document 4 is ideal.

However, in Non-patent Document 4, since a benzene ring uses a precursor based on three anthracene skeletal structures, it is impossible to form a GNR with a ribbon width of 1 nm or more. From a viewpoint of FET designing, controlling a size of a band gap by changing a ribbon width of a GNR is a significant technique, but in high-order acene with four or more benzene rings, a plurality of benzene rings with high reactivity exist in the inner side and thus stable linear coupling is not done, and there is a possibility that a GNR with random edge structures are consequently formed.

Further, to fabricate an FET by using the GNR formed by the method of Non-patent Document 4, a high risk process is required in which the GNR is separated from a metal substrate and transferred to another insulating substrate (for example, an Si substrate on a surface of which a silicon oxide film is formed). Further, since a position and a direction of the GNR transferred as above are not controlled, an FET manufacturing process such as a step of forming an electrode in the GNR, is quite difficult, and thus a simpler process is required.

SUMMARY

A graphene film of the present invention is a ribbon-shaped graphene film and includes: five or more six-membered rings of carbon atoms which are bonded and arranged in line in a short side direction; and an armchair type edge structure along a long side direction.

An electronic device of the present invention includes: an insulating material; a pair of electrodes on the insulating material; a ribbon-shaped graphene film bridged by the pair of electrodes, wherein the graphene film has five or more six-membered rings of carbon atoms which are bonded and arranged in line in a short side direction and an armchair type edge structure along a long side direction.

A method for manufacturing an electronic device of the present invention includes: forming a thin metal wire on an insulating material; forming a ribbon-shaped graphene film that has five or more six-membered rings of carbon atoms which are bonded and arranged in line in a short side direction and an armchair type edge structure along a long side direction, on the thin metal wire; and removing the thin metal wire.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, suitable embodiments to which the present invention is applied will be described in detail with reference to the drawings. Note that in the following drawings, some composing members are not illustrated relatively accurate in largeness, thickness, or the like for convenience sake of illustration.

First Embodiment

In this embodiment, a configuration of a GNR will be described together with a method for manufacturing the same.

Figure 1A:
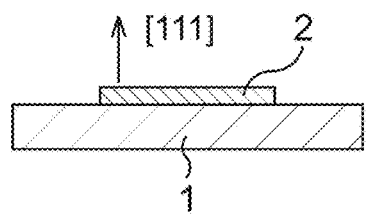
FIG. 1A are schematic diagrams illustrating a method for manufacturing a GNR according to a first embodiment in order of steps.
Figure 1A:
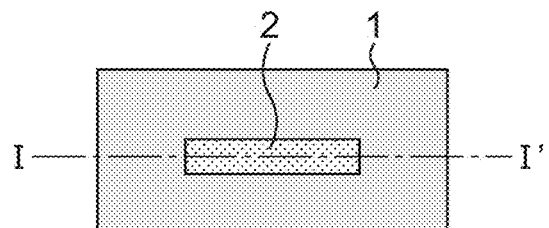
Figure 1B:
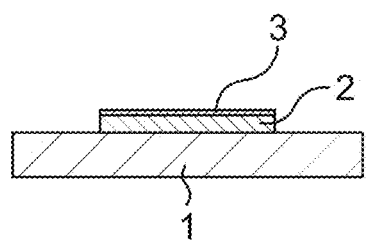
FIG. 1B are schematic diagrams illustrating the method for manufacturing the GNR according to the first embodiment in order of steps.
Figure 1B:
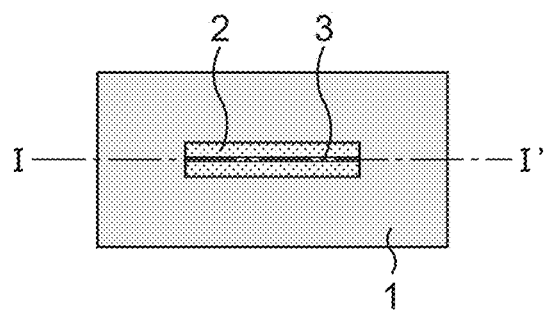
Figure 1C:
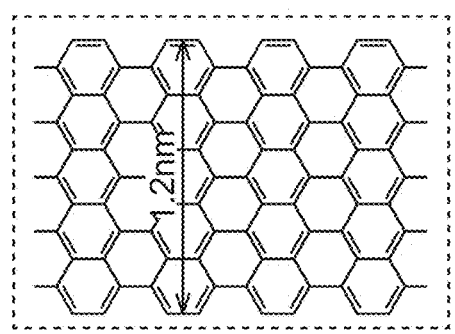
FIG. 1C is a schematic diagram illustrating the method for manufacturing the GNR according to the first embodiment in order of steps.

FIG. 1A to FIG. 1C are schematic diagrams illustrating the method for manufacturing the GNR according to the first embodiment in order of steps, and in FIG. 1A and FIG. 1B, right side drawings are plan views and left side drawings are cross-sectional views taken along dashed lines I-I' of the plan views.

First, as illustrated in FIG. 1A, an insulating substrate 1 is prepared and a thin metal wire 2 which has a (111) crystal surface is formed on the insulating substrate 1.

As the insulating substrate 1, a mica substrate, a C-surface sapphire ($\alpha$-$Al_2O_3$) crystal substrate, MgO (111) crystal substrate, and so on, for example, are applicable as a substrate of an insulating crystal, and the mica substrate is used in this embodiment.

As a thin metal wire material, at least one kind selected from Au, Ag, Cu, Co, Ni, Pd, Ir, Pt, and so on is applicable. By properly selecting the kind of the substrate, an epitaxial crystal surface of such a metal can be obtained. In this embodiment, Au is used as the thin metal wire material. It is well known that Au is highly oriented in a (111) surface on the mica substrate.

In detail, first, by cleaving the insulating substrate 1 being the mica substrate in an atmosphere, a clean surface of the insulating substrate 1 is obtained.

Next, a double-layer resist for forming a desired fine line pattern is spin-coated on a cleaved surface of the insulating substrate 1. For a sacrificial layer resist of a lower layer, PMGI SFG2S (manufactured by MiChrochem Corp.), for example, is used, and for an electron beam resist of an upper layer, a resist obtained by diluting ZEP520A (manufactured by ZEON CORPORATION) by ZEP-A (manufactured by ZEON CORPORATION) at a ratio of 1:1, for example, is used.

Next, a resist pattern which has an opening of a thin wire shape of about 10 nm to about 100 nm in width and about 100 nm to about 500 nm in length is formed in the resist by electron beam lithography. Thereafter, while the substrate is heated to about 100° C. to about 200° C., for example to about 150° C., in a vacuum chamber (degree of vacuum is $1 \times 10^{-7}$ Pa or less), Au is deposited on the insulating substrate 1 by a vapor deposition method at a vapor deposition speed of about 0.05 nm/s to about 5 nm/s, for example at about 0.5 nm/s. Au is deposited to a thickness of about 10 nm to about 100 nm, for example of about 20 nm.

Note that in order to heighten adhesiveness between Au and the insulating substrate 1, Ti may be deposited to a thickness of about 0.5 nm to about 1 nm between Au and the insulating substrate 1.

Further, as a deposition method of a thin metal wire material, it is also possible to use a sputtering method, a pulse laser deposition method, a molecular beam epitaxy method, or the like, instead of the vapor deposition method.

After Au is deposited on the insulating substrate 1, the resist pattern and Au thereon are removed by lift-off. By the above, the thin metal wire 2 which has the (111) surface is formed on the insulating layer 1. The thin metal wire 2 is formed to have a thickness of about 20 nm, a width (size in a short side direction) of about 20 nm, and a length (size in a long side direction) of about 200 nm.

Next, to the thin metal wire 2, a cleaning processing of an Au surface, the processing constituted with Ar ion sputtering and ultrahigh vacuum annealing as one set, is repeated plurality of cycles, here, repeated four cycles. In the surface cleaning processing, per one set, Ar ion sputtering is carried out for one minute, with an ion acceleration voltage being set at about 0.8 kV and an ion current being set at about 1.0 µA, and ultrahigh vacuum annealing is carried out for 15 minutes at about 470° C. while the degree of vacuum is kept at $5 \times 10^{-7}$ or less.

By this surface cleaning processing, an organic residue such as the resist attached to the surface of Au at a time of lift-off is removed. Further, a (111) reconstructive surface of Au is obtained in the thin metal wire 2, and flatness at an atomic level is further improved.

Subsequently, as illustrated in FIG. 1B, a GNR 3 is formed on the thin metal wire 2.

In detail, by a thermal conversion type precursor method, the GNR 3 is formed in situ on the (111) surface of the thin metal wire 2 in the vacuum chamber of the ultrahigh vacuum degree, without exposing the insulating substrate 1 and the thin metal wire 2 to the atmosphere.

The GNR 3, as illustrated in FIG. 1C, has a monoatomic structure, in which five or more six-membered rings (benzene rings) of carbon atoms are bonded and arranged in line in a short side direction and an edge structure along a long side direction is of complete armchair type. In this embodiment, as the GNR3 is formed a pentacene GNR which is constituted with five bonded benzene rings and whose ribbon width (size in a short side direction) is about 1.2 nm.

Hereinafter, by using FIG. 2A to FIG. 2D, a forming process of the pentacene GNR by the thermal conversion type precursor method will be described.

Figure 2A:
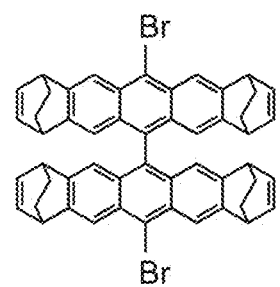
FIG. 2A is a schematic diagram illustrating a synthetic scheme of a pentacene GNR in the first embodiment.

A structural formula of a pentacene dimer precursor is illustrated in FIG. 2A. In this pentacene dimer precursor, a Br group is introduced to each one side of the benzene rings in the center of two pentacene skeletal structures. As a result that bicyclo skeletal structures are introduced to both ends of the pentacene skeletal structures, a thermal conversion type precursor becomes high in stability.

The pentacene dimer precursor is sublimated by using a K-cell type evaporator under ultrahigh vacuum of $5 \times 10^{-8}$ Pa or less, for example, and vapor-deposited on the thin metal wire 2. A vapor-deposition speed is about 0.05 nm/min to about 0.1 nm/min.

Figure 2B:
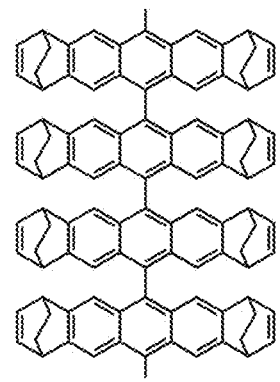
FIG. 2B is a schematic diagram illustrating the synthetic scheme of the pentacene GNR in the first embodiment.
Figure 2C:
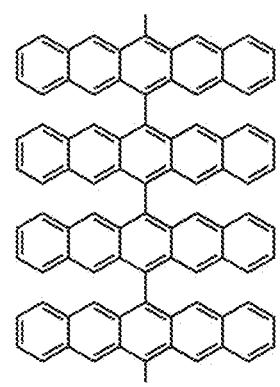
FIG. 2C is a schematic diagram illustrating the synthetic scheme of the pentacene GNR in the first embodiment.
Figure 2D:
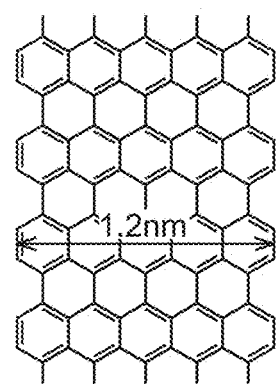
FIG. 2D is a schematic diagram illustrating the synthetic scheme of the pentacene GNR in the first embodiment.

As will be described below, a substrate temperature is raised, and through processes illustrated in FIG. 2B to FIG. 2C, a pentacene GNR of FIG. 2D is finally formed.

First, the pentacene dimer precursor of FIG. 2A is vapor-deposited on the insulating substrate 1 having been heated to about 180° C. to about 250° C., for example. On this occasion, as illustrated in FIG. 2B, the pentacene dimer precursors are coupled in line by radical polymerization.

Next, by raising the substrate temperature to about 250° C. to about 300° C., for example, the bicyclo skeletal structure is aromatized by a reverse Diels-Alder reaction and a $C_2H_4$ molecule is eliminated. Thereby, as illustrated in FIG. 2C, a macromolecule in which pentacenes are linearly coupled is obtained.

Then, the substrate temperature is raised to about 350° C. to about 450° C., for example, and the temperature is kept for about 10 minutes to about 20 minutes. By the above, as illustrated in FIG. 2D, a pentacene GNR which has a uniform width of about 1.2 nm and in which an edge structure along a long side direction is of complete armchair type is formed by a ring-condensation reaction.

A band gap of the pentacene GNR of about 1.2 nm in width obtained as described above is estimated to be about 0.9 eV from a first-principles calculation (for example, see Non-patent Document 1).

As described above, according to this embodiment, as a result of synthesis in a bottom up manner from a high-order acene precursor by using the thermal conversion type precursor method, it is possible to form a pentacene GNR of complete armchair type with a uniform width of about 1.2 nm and a uniform edge structure.

Further, as a result of forming the pentacene GNR on the thin metal wire which has the (111) crystal surface, it becomes possible to control a position and a direction of the pentacene GNR, and the pentacene GNR can be obtained by a simpler manufacturing process without carrying out a high-risk transfer process of a GNR.

MODIFICATION EXAMPLES

Hereinafter, modification examples of the first embodiment will be described.

Modification Example 1

In this example, a GNR is fabricated similarly to in the first embodiment, but a case where a heptacene GNR is fabricated as a GNR instead of the pentacene GNR will be exemplified.

First, similarly to in the first embodiment, through a step of FIG. 1A, a thin metal wire 2 which has a (111) crystal surface is formed on an insulating substrate 1.

Subsequently, similarly to in FIG. 1B, a GNR 3 is formed on the thin metal wire 2. In this example, as the GNR 3 is formed a heptacene GNR which is constituted with seven bonded benzene rings and whose ribbon width (size in a short side direction) is about 1.7 nm. In this example, in order to polymerize heptacene more stably, an optical conversion type precursor method by light irradiation is used in addition to a thermal conversion type precursor method by substrate heating.

Hereinafter, by using FIG. 3A to FIG. 3C, a formation process of the heptacene GNR by the thermal conversion type precursor method and the photo conversion type precursor method will be described.

Figure 3A:
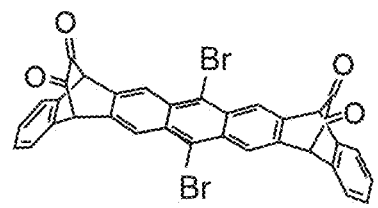
FIG. 3A is a schematic diagram illustrating a synthetic scheme of a heptacene GNR in a modification example 1 of the first embodiment.
Figure 3B:
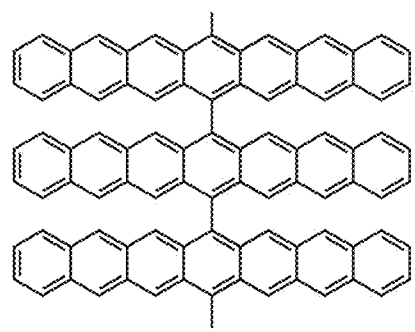
FIG. 3B is a schematic diagram illustrating the synthetic scheme of the heptacene GNR in the modification example 1 of the first embodiment.

A structural formula of the heptacene precursor is illustrated in FIG. 3A. In this heptacene precursor, Br groups are respectively introduced to both sides of a benzene ring in the center of one heptacene skeletal structure.

The heptacene precursor is sublimated by using a K-cell type evaporator under ultrahigh vacuum of $5 \times 10^{-8}$ Pa or less, for example, and vapor-deposited on the thin metal wire 2. A vapor-deposition speed is about 0.05 nm/min to about 0.1 nm/min.

Figure 3C:
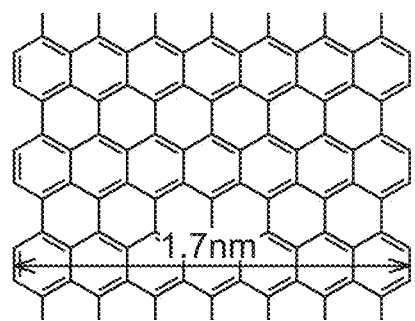
FIG. 3C is a schematic diagram illustrating the synthetic scheme of the heptacene GNR in the modification example 1 of the first embodiment.

As will be described below, light irradiation is carried out together with substrate heating, and through a process illustrated in FIG. 3B, a heptacene GNR of FIG. 3C is finally formed.

First, the heptacene precursor of FIG. 3A is vapor-deposited on the insulating substrate 1 having been heated to about 180° C. to about 250° C., while blue light of about 470 nm in wavelength is being irradiated to the insulating substrate 1 and the thin metal wire 2.

Next, while the above-described blue light is being irradiated, a substrate temperature is raised to about 250° C. to about 300° C., for example, whereby a bicyclo skeletal structure is aromatized by a reverse Diels-Alder reaction and a CO molecule is eliminated. Thereby, as illustrated in FIG. 3B, a macromolecule in which heptacenes are linearly coupled is obtained.

Then, while the above-described blue light is being irradiated, the substrate temperature is raised to about 350° C. to about 450° C., for example, and the temperature is kept for about 10 minutes to about 20 minutes. By the above, as illustrated in FIG. 3C, a heptacene GNR which has a uniform width of about 1.7 nm and in which an edge structure along a long side direction is of complete armchair type is formed by a ring-condensation reaction.

A band gap of the heptacene GNR of about 1.7 nm in width obtained as described above is estimated to be about 1.4 eV from a first-principles calculation (for example, see Non-patent Document 1).

As described above, according to the this example, as a result of synthesis in a bottom up manner from a high-order acene precursor by using the thermal conversion type precursor method and the photo conversion type precursor method, it is possible to form a heptacene GNR of complete armchair type with a uniform width of about 1.7 nm and a uniform edge structure.

Further, as a result of forming the heptacene GNR on the thin metal wire which has the (111) crystal surface, it becomes possible to control a position and a direction of the heptacene GNR, and the heptacene GNR can be obtained by a simpler manufacturing process without carrying out a high-risk transfer process of a GNR.

Modification Example 2

In this example, though a GNR is fabricated similarly to in the first embodiment, a case where a nonacene GNR is fabricated as a GNR instead of the pentacene GNR will be exemplified.

First, similarly to in the first embodiment, through a step of FIG. 1A, a thin metal wire 2 which has a (111) crystal surface is formed on an insulating substrate 1.

Subsequently, similarly to in FIG. 1B, a GNR 3 is formed on the thin metal wire 2. In this example, as the GNR 3 is formed a nonacene GNR which is constituted with nine bonded benzene rings and whose ribbon width (size in a short side direction) is about 2.2 nm. In this example, in order to polymerize nonacene more stably, an optical conversion type precursor method by light irradiation is used in addition to a thermal conversion type precursor method by substrate heating.

Hereinafter, by using FIG. 4A to FIG. 4D, a formation process of the nonacene GNR by the thermal conversion type precursor method and the photo conversion type precursor method will be described.

Figure 4A:
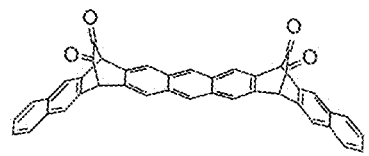
FIG. 4A is a schematic diagram illustrating a synthetic scheme of a nonacene GNR in a modification example 2 of the first embodiment.

A structural formula of the nonacene precursor is illustrated in FIG. 4A. In this nonacene precursor, it is unnecessary to introduce a Br group to a benzene ring of the center as a reactive site, since nonacene itself has a biradical property.

The nonacene precursor is sublimated by using a K-cell type evaporator under ultrahigh vacuum of $5\times10^{-8}$ Pa or less, for example, and vapor-deposited on the thin metal wire 2. A vapor-deposition speed is about 0.05 nm/min to about 0.1 nm/min.

Figure 4B:
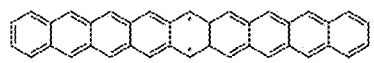
FIG. 4B is a schematic diagram illustrating the synthetic scheme of the nonacene GNR in the modification example 2 of the first embodiment.
Figure 4C:
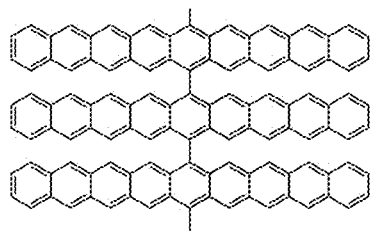
FIG. 4C is a schematic diagram illustrating the synthetic scheme of the nonacene GNR in the modification example 2 of the first embodiment.
Figure 4D:
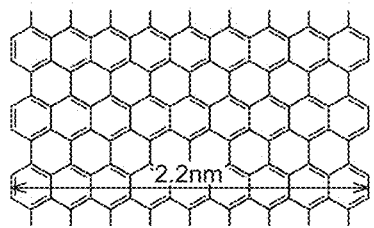
FIG. 4D is a schematic diagram illustrating the synthetic scheme of the nonacene GNR in the modification example 2 of the first embodiment.

As will be described below, light irradiation is carried out together with substrate heating, and through a process illustrated in FIG. 4B to FIG. 4C, a nonacene GNR of FIG. 4D is finally formed.

First, the nonacene precursor of FIG. 4A is vapor-deposited on the insulating substrate 1 having been heated to about 180° C. to about 250° C., for example, while blue light of about 470 nm in wavelength is being irradiated to the insulating substrate 1 and the thin metal wire 2. A state at this time is illustrated in FIG. 4B.

Next, while the above-described blue light is being irradiated, a substrate temperature is raised to about 250° C. to about 300° C., for example, whereby a bicyclo skeletal structure is aromatized by a reverse Diels-Alder reaction and a CO molecule is eliminated. Thereby, as illustrated in FIG. 4C, a macromolecule in which nonacenes are linearly coupled is obtained.

Then, while the above-described blue light is being irradiated, the substrate temperature is raised to about 350° C. to about 450° C., for example, and the temperature is kept for about 10 minutes to about 20 minutes. By the above, as illustrated in FIG. 4D, a nonacene GNR which has a uniform width of about 2.2 nm and in which an edge structure along a long side direction is of complete armchair type is formed by a ring-condensation reaction.

A band gap of the nonacene GNR of about 2.2 nm in width obtained as described above is estimated to be about 1.7 eV from a first-principles calculation (for example, see Non-patent Document 1).

As described above, according to the this example, as a result of synthesis in a bottom up manner from a high-order acene precursor by using the thermal conversion type precursor method and the photo conversion type precursor method, it is possible to form a nonacene GNR of complete armchair type which has a uniform width of about 2.2 nm and a uniform edge structure.

Further, as a result of forming the nonacene GNR on the thin metal wire which has the (111) crystal surface, it becomes possible to control a position and a direction of the nonacene GNR, and the nonacene GNR can be obtained by a simpler manufacturing process without carrying out a high-risk transfer process of a GNR.

Second Embodiment

In this embodiment, a configuration of a graphene transistor which uses a GNR as a channel will be described together with a method for manufacturing the same.

FIG. 5A to FIG. 5D are schematic diagrams illustrating a method for manufacturing a graphene transistor according to a second embodiment in order of steps, and in FIG. 5A to FIG. 5D, right side drawings are plan views and left side drawings are cross-sectional views taken along dashed lines I-I' of the plan views.

Figure 5A:
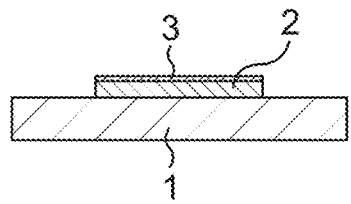
FIG. 5A are schematic diagrams illustrating a method for manufacturing a graphene transistor according to a second embodiment in order of steps.
Figure 5A:
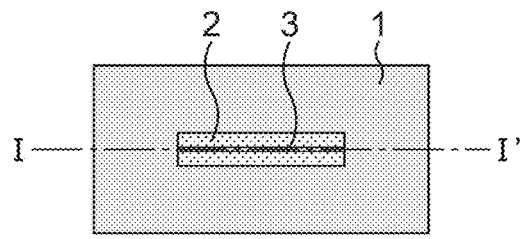

First, through each step of FIG. 1A and FIG. 1B described in the first embodiment, a thin metal wire 2 is formed on an insulating substrate 1, and a GNR 3 is formed on the thin metal wire 2. A state at this time is illustrated in FIG. 5A.

In this embodiment, as the GNR 3, any one of GNRs of the pentacene GNR described in the first embodiment, the heptacene GNR described in the modification example 1, and the nonacene GNR described in the modification example 2 is formed.

Figure 5B:
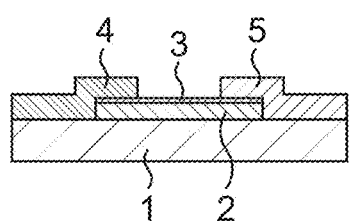
FIG. 5B are schematic diagrams illustrating the method for manufacturing the graphene transistor according to the second embodiment in order of steps.
Figure 5B:
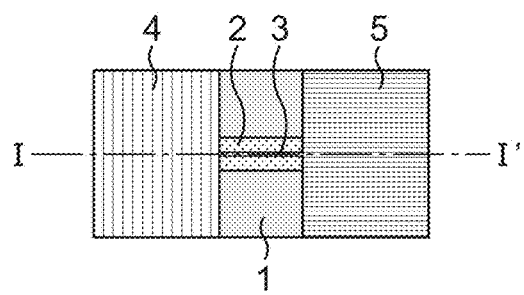

Subsequently, as illustrated in FIG. 5B, a source electrode 4 and a drain electrode 5 are formed.

In detail, first, similarly to in the step of forming the thin metal wire 2, a resist pattern made of a double-layer resist is formed by electron beam lithography.

Next, as an electrode material, Ti and Cr, for example, are sequentially deposited by a vapor deposition method under ultrahigh vacuum of $1\times10^{-5}$ Pa or less. As for Ti, a vapor deposition speed is about 0.05 nm/s to about 0.1 nm/s and a thickness thereof is about 0.5 nm to about 1 nm. As for Cr, a vapor deposition speed is about 0.1 nm/s to about 1 nm/s and a thickness thereof is about 30 nm to about 50 nm.

As a deposition method for the electrode material, it is also possible to use a sputtering method, a pulse laser deposition method, or the like, instead of the vapor deposition method.

Then, the resist pattern and Ti and Cr thereon are removed by lift-off. By the above, the source electrode 4 and the drain electrode 5 electrically connected to each end portion of the thin metal wire 2 are formed.

The thin metal wire 2 is finally removed by wet etching being a post step. Therefore, metal species of the electrode materials of the source electrode 4 and the drain electrode 5 are required to have sufficient etching resistance to metal species of the thin metal wire 2.

As will be describe later, when a $HNO_3$+HCl mixed aqueous solution is used for an etchant for wet etching of a thin metal wire 2 of Au (111), Ti and Cr which are not dissolved into that etchant are suitable for the metal species of an electrode material.

Further, when Cu(111) is used for the material of the thin metal wire 2, a $FeCl_3$ aqueous solution can be used for the etchant for wet etching thereof. On this occasion, when a source electrode and a drain electrode are formed, it is necessary to properly choose metal species which have sufficient etching resistance to such aqueous solutions.

Figure 5C:
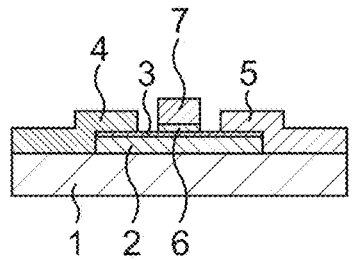
FIG. 5C are schematic diagrams illustrating the method for manufacturing the graphene transistor according to the second embodiment in order of steps.
Figure 5C:
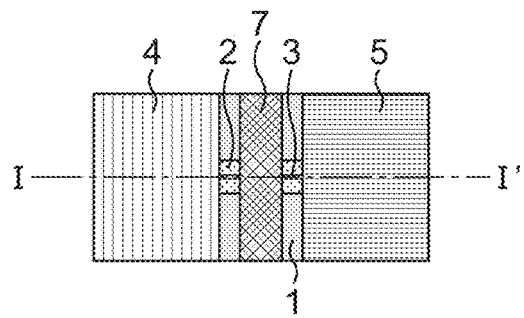

Subsequently, as illustrated in FIG. 5C, a gate electrode 7 is formed on the thin metal wire 2 between the source electrode 4 and the drain electrode 5 via a gate insulating film 6.

In detail, first, similarly to in a step of forming the thin metal wire 2, a resist pattern made of a double-layer resist is formed by electron beam lithography.

Next, an insulating material of the gate insulating film and an electrode material of the gate electrode are sequentially deposited. For the insulating material, $Y_2O_3$, for example, is used, and for the electrode material, Ti and Cr, for example, are used, respectively.

$Y_2O_3$ is formed by vapor-depositing Y metal while introducing $O_2$ gas under ultrahigh vacuum of $1\times10^{-5}$ Pa or less.

Ti and Cr are formed by vapor-deposition under vapor-deposition condition and to a thickness similar to those at a time of formation of the source electrode 4 and the drain electrode 5.

As a deposition method for the insulating material and the electrode material, it is possible to use a sputtering method, a pulse laser deposition method, or the like, instead of the vapor-deposition method.

Then, the resist pattern and $Y_2O_3$, Ti, and Cr thereon are removed by lift-off. By the above, a top gate stack structure of the gate insulating film 6 and the gate electrode 7 is formed in a manner not to overlap the source electrode 4 and the drain electrode 5 between the source electrode 4 and the drain electrode 5 and in a manner to intersect the thin metal wire 2 on the thin metal wire 2. The gate electrode 7 is formed to have a gate length of about 50 nm, for example.

As an insulating material of the gate insulating film, it is also possible to use $SiO_2$, $HfO_2$, $ZrO_2$, $La_2O_3$, $TiO_2$, or the like instead of $Y_2O_3$, by a vapor deposition method in which oxygen gas is introduced similarly to in deposition of $Y_2O_3$.

It is necessary for the insulating material of the gate insulating film and the electrode material of the gate electrode to have sufficient etching resistance to the etchant for wet etching used in a removing processing, being a post step, of the thin metal wire.

Figure 5D:
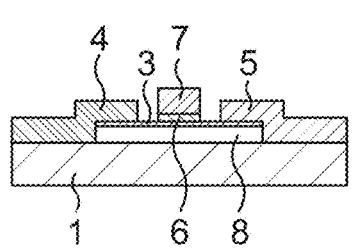
FIG. 5D are schematic diagrams illustrating the method for manufacturing the graphene transistor according to the second embodiment in order of steps.
Figure 5D:
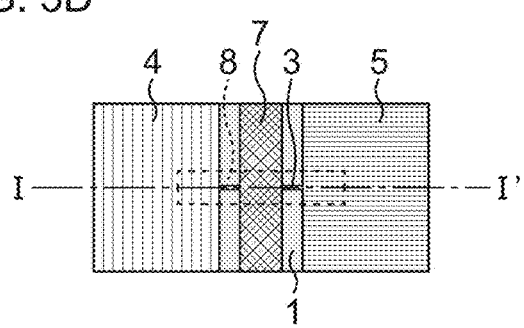

Subsequently, as illustrated in FIG. 5D, the thin metal wire 2 is removed by wet etching.

In detail, the thin metal wire 2 is wet-etched by using a $HNO_3$ (6.5 vol %)+HCl (17.5 vol %) mixed aqueous solution of about 60° C. as an etchant. Thereby, the thin metal wire 2 is removed. A gap 8 is formed between the insulating substrate 1 and the GNR 3, and the GNR 3 becomes in a state of being bridged by the source electrode 4 and the drain electrode 5.

After the thin metal wire 2 is removed, a cleaning processing in which pure water is used and a rinsing processing in which isopropyl alcohol is used are sequentially carried out to the insulating substrate 1. In a subsequent drying processing, with the aim of preventing cutting of the GNR by a surface tension or a capillary force of a solution, a supercritical drying processing in which $CO_2$ gas is used, for example, is carried out.

By the above, a top gate type graphene transistor which uses the GNR according to the first embodiment or modification examples for a channel is obtained.

According to this embodiment, by using the GNR 3 obtained by the first embodiment or the modification examples for the channel, there is obtained a graphene transistor which exhibits an excellent band gap and which has high reliability to materialize an electric current on-off ratio of $10^5$ or more at a time of operation at a room temperature.

Note that in this embodiment though the graphene transistor is exemplified as an electronic device in which the GNR according the first embodiment is used, the present invention is not limited thereto. For example, it is possible to apply the present invention to a display or the like in which a GNR is used for a display electrode.

According to the present invention, without using a transfer method, there are materialized a graphene film which has an armchair type edge structure with a uniform width at a desired value and which enables an electric current on-off ratio of $10^5$ or more that is practically sufficient for exhibiting a desired band gap, and a highly reliable electronic device that has the same.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method for manufacturing an electronic device, the method comprising:
   forming a thin metal wire on an insulating material;
   by a thermal conversion type precursor method with using a pentacene dimer precursor in which a Br group is introduced to each one side of a benzene rings in a center of two pentacene skeletal structures, or by a thermal conversion type precursor method and a photo conversion type precursor method with using a pentacene dimer precursor in which Br groups respectively introduced to both sides of a benzene ring in a center of one pentacene skeletal structure or a nonacene precursor, forming a ribbon-shaped graphene film that has five or more six-membered rings of carbon atoms which are bonded and arranged in line in a short side direction and an armchair type edge structure along a long side direction, on the thin metal wire; and removing the thin metal wire.

2. The method for manufacturing the electronic device according to claim 1, wherein in the graphene film a width of a portion where the five or more six-membered rings of carbon atoms are bonded and arranged in line in the short side direction is 1.2 nm or more.

3. The method for manufacturing the electronic device according to claim 1, wherein the insulating material is a substrate of an insulating crystal.

4. The method for manufacturing the electronic device according to claim 1, wherein the thin metal wire is formed of at least one kind selected from Au, Ag, Cu, Co, Ni, Pd, Ir, and Pt.

* * * * *